(12) United States Patent
Han

(10) Patent No.: US 9,543,230 B2
(45) Date of Patent: Jan. 10, 2017

(54) SEMICONDUCTOR DEVICE AND METHOD OF MANUFACTURING THE SAME

(71) Applicant: SK hynix Inc., Gyeonggi-do (KR)

(72) Inventor: Yong Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/264,788

(22) Filed: Apr. 29, 2014

(65) Prior Publication Data

US 2015/0162263 A1    Jun. 11, 2015

(30) Foreign Application Priority Data

Dec. 10, 2013  (KR) .......................... 10-2013-0153172

(51) Int. Cl.
| | | |
|---|---|---|
| *H01L 21/768* | (2006.01) | |
| *H01L 23/48* | (2006.01) | |
| *H01L 27/115* | (2006.01) | |

(52) U.S. Cl.
CPC ........... *H01L 23/481* (2013.01); *H01L 21/768* (2013.01); *H01L 27/11582* (2013.01); *H01L 2924/0002* (2013.01)

(58) Field of Classification Search
CPC ................... H01L 2924/0002; H01L 2924/00; H01L 21/768; H01L 23/481; H01L 27/1158; H01L 27/11582; H01L 27/11524; H01L 27/11556; H01L 27/1157
See application file for complete search history.

(56) References Cited

U.S. PATENT DOCUMENTS 8,378,412 B2   2/2013 Goda

*Primary Examiner* — Tony Tran
(74) *Attorney, Agent, or Firm* — IP & T Group LLP

(57) ABSTRACT

The semiconductor device includes first interlayer insulating layers and first conductive patterns which are alternately stacked; a second interlayer insulating layer formed on the first interlayer insulating layers and the first conductive patterns; and a slit passing through the second interlayer insulating layer, the first interlayer insulating layers and the first conductive patterns to divide the first interlayer insulating layers and the first conductive patterns into stack structures.

11 Claims, 6 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2013-0153172 filed on Dec. 10, 2013 the entire disclosure of which is incorporated by reference herein.

BACKGROUND

1. Field of the Invention

Various embodiments of the present invention relate to a semiconductor device and a method of manufacturing the same, and more particularly, to a semiconductor device having a 3-dimensional cell string and a method of manufacturing the same.

2. Description of the Related Art

Generally, a cell string of a semiconductor device is formed in a 2-dimensional (2D) structure configured to form memory cells in a single-layer form on a substrate. A degree of integration of the 2D cell string may be enhanced by reducing the area of a plane occupied by the memory cells using a fine pattern forming method.

Since technologies that enhance the degree of integration for the above-described 2D cell string have reached a limit, a 3-dimensional (3D) cell string configured to stack memory cells in a multi-layer form on a substrate has been proposed. A degree of integration of this 3D cell string may be enhanced without reducing the area of a plane occupied by the memory cells.

The 3D cell string is formed along a channel structure passing through interlayer insulating layers and conductive patterns, which are alternately stacked on a substrate. The interlayer insulating layers and the conductive patterns may be penetrated by a slit and divided into a plurality of stack structures. The channel structure may be connected to conductive lines such as bit lines, source lines, etc. via a contact plug, which is connected over the channel structure.

Since a contact area between the contact plug and the channel structure is small, misalignment between the contact plug and the channel structure easily occurs during the fabrication processing. Hereinafter, causes of the misalignment between the contact plug and the channel structure are described in further detail.

After forming the slit, thermal stress may be applied to the substrate. Due to the thermal stress, the conductive patterns may be bent. When the number of the interlayer insulating layers and the conductive patterns that constitute the stack structure are increased to enhance a degree of integration of the 3D cell string, bending of the conductive patterns becomes more severe. When the conductive patterns are bent, the location of the channel structure passing through the conductive patterns may be changed. As a result, the misalignment between the contact plug and the channel structure may occur.

SUMMARY

Various embodiments of the present invention are directed to a semiconductor device and a method of manufacturing the same, to reduce misalignment between the contact plug and the channel structure.

One embodiment of the present invention provides a semiconductor device including: first interlayer insulating layers and first conductive patterns which are alternately stacked; a second interlayer insulating layer formed on the first interlayer insulating layers and the first conductive patterns; and a slit passing through the second interlayer insulating layer, the first interlayer insulating layers and the first conductive patterns to divide the first interlayer insulating layers and the first conductive patterns into stack structures.

Another embodiment of the present invention provides a semiconductor device including: first interlayer insulating layers and first conductive patterns, which are alternately stacked; a second interlayer insulating layer formed on the first interlayer insulating layers and the first conductive patterns; and a slit insulating layer passing through the second interlayer insulating layer, the first interlayer insulating layers and the first conductive patterns to divide the first interlayer insulating layers and the first conductive patterns into stack structures, wherein the slit insulating layer protrudes higher than the stack structures.

Still another embodiment of the present invention provides a method of manufacturing a semiconductor device including: alternately stacking first material layers and second material layers; forming a channel structure passing through the first material layers and the second material layers; forming an interlayer insulating layer on the first material layers and the second material layers; forming a contact plug connected to the channel structure through the interlayer insulating layer; and forming a slit dividing the first material layers and the second material layers into stack structures by etching the interlayer insulating layer, the first material layers and the second material layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1A:
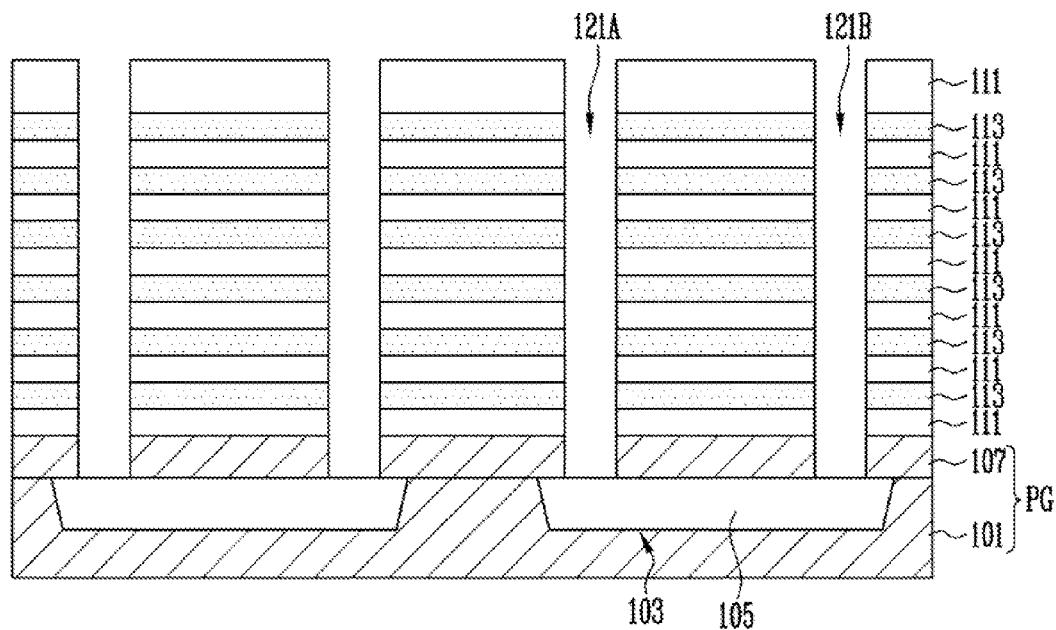
FIGS. 1A to 1E are cross-sectional views illustrating a semiconductor device according to a first embodiment of the present invention.

Preferred embodiments of the present invention are described below. In the drawings, elements and regions are not drawn to scale, and their sizes and thicknesses may be exaggerated for clarity. In the description of the present invention, known configurations that are not central to the principles of the present invention may be omitted. Throughout the drawings and corresponding description, the same components are denoted by the same reference numerals. However, the present invention is not limited to an embodiment disclosed below and may be implemented in various forms. The embodiment is provided only for illustrative purposes and for full understanding of the scope of the present invention by those skilled in the art, and the scope of the present invention will be understood by the claims of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIGS. 1A to 1E are cross-sectional views illustrating a semiconductor device according to a first embodiment of the present invention.

Referring to FIG. 1A, a pipe gate PG having an inside filled with a sacrificial layer 105 is formed on a substrate (not shown). A process of forming the pipe gate PG may include forming a first pipe gate layer 101 on the substrate covered with an insulating layer (not shown), forming a trench 103 by etching the first pipe gate layer 101, filling the inside of the trench 103 with the sacrificial layer 105, and forming a second pipe gate layer 107 on the first pipe gate layer 101 filled with the sacrificial layer 105. The first and second pipe gate layers 101 and 107 may be formed of a conductive material, for example, a silicon layer. The sacrificial layer 105 may be formed of a material layer having an etch selectivity with respect to the first and second pipe gate layers 101 and 107, for example, a titanium nitride layer (TiN).

First material layers 111 and second material layers 113 are alternately stacked on the pipe gate PG filled with the sacrificial layer 105. The first material layers 111 and the second material layers 113 may be formed of various materials.

For example, the first material layers 111 may be formed of an insulating material for a first interlayer insulating layer and the second material layers 113 may be formed of a sacrificial material having an etch selectivity with respect to the first material layers 111. In this case, the first material layers 111 may be formed of silicon oxide layers and the second material layers 113 may be formed of nitride layers.

As another example, the second material layers 11 may be formed of the conductive material and the first material layers 111 may be formed of the sacrificial material having an etch selectivity with respect to the second material layers 113. In this case, the second material layers 113 may be formed of a doped silicon layer and the first material layers 111 may be formed of an un-doped silicon layer.

As still another example, the first material layers 111 may be formed of an insulating material for a first interlayer insulating layer and the second material layers 113 may be formed of a conductive material. In this case, the first material layers 111 may be formed of silicon oxide layers and the second material layers 113 may be formed of a conductive material, such as a silicon layer, a metal silicide layer, a metal layer, and so on.

Using the various materials described above, after the first material layers 111 and the second material layers 113 are formed, a first through region 121A and a second through region 121B passing through the first material layers 111 and the second material layers 113 are formed. When the second pipe gate layer 107 is formed, the first through region 121A and the second through region 121B pass through the second pipe gate layer 107. The first through region 121A and the second through region 121B are connected to the trench 103 to expose the sacrificial layer 105. Cross-sections of the first and second through regions 121A and 121B may be various shapes such as a circle, an oval, a polygon, etc.

Figure 1B:
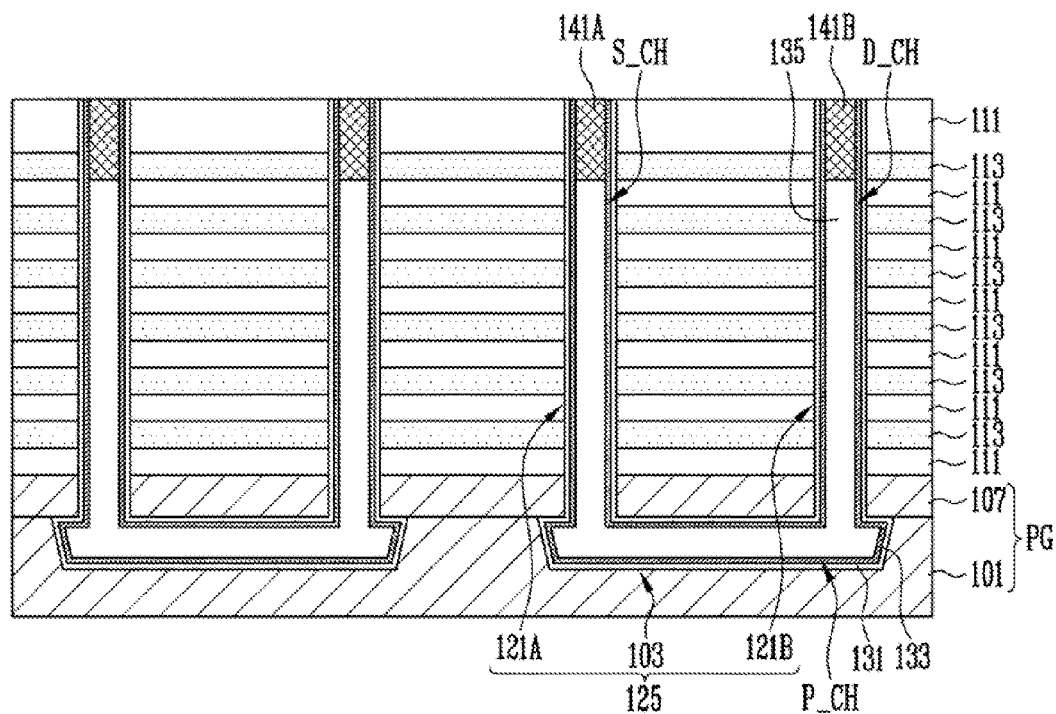

Referring to FIG. 1B, the trench 103 is opened by removing the sacrificial layer 105 exposed through first and second through regions 121A and 121B selectively. Thus, a through hole 125 including the first and second through regions 121A and 121B and the trench 103 is formed.

A memory layer 131 may be formed along the through hole 125. The memory layer 131 may be multiple layers including a blocking insulating layer, a data storage layer and a tunnel insulating layer, multiple layers including the data storage layer and the tunnel insulating layer or a single layer including the tunnel insulating layer. A layer which is not formed along the through hole 125 among the blocking insulating layer, the data storage layer and the tunnel insulating layer that constitute the memory layer 131 may be formed along a recess region of the second material layers 113 that will be described in the following FIG. 1D. The blocking insulating layer may be formed of an oxide layer as a material layer to prevent the movement of charges. The data storage layer may be formed of a silicon nitride layer that may trap charges. The tunnel insulating layer may be formed of a silicon oxide layer as an energy barrier layer for Fowler-Nordheim (F-N) tunneling.

Then, a channel structure 133 is formed inside the through hole 125. The channel structure 133 may be formed of a semiconductor layer, for example, a silicon layer. The channel structure 133 may be formed to have a hollow center in a tube shape or to fill the inside of the through hole 125. When the channel structure 133 is formed in a tube shape, the center region of the channel structure 133 may be filled with an insulating layer 135. The channel structure 133 includes a first channel layer S_CH formed in the first through region 121A, a second channel layer D_CH formed in the second through region 121B, and a pipe channel layer P_CH formed in the trench 103 and connecting the first and second channel layers S_CH and D_CH.

The insulating layer 135 filling the center region of the channel structure 133 may be recessed by a constant thickness. In this case, the insulating layer 135 has a smaller height than the channel structure 133 and the recess regions are defined on the insulating layer 135. The recess regions may be filled with doped silicon patterns 141A and 141B. The doped silicon patterns 141A and 141B may be classified as a first doped silicon pattern 141A formed in the first through region 121A and a second doped silicon pattern 141B formed in the second through region 121B. The first doped silicon patterns 141A may be used as a source region of a cell string and the second doped silicon pattern 141B may be used as a drain region of a cell string.

Figure 1C:
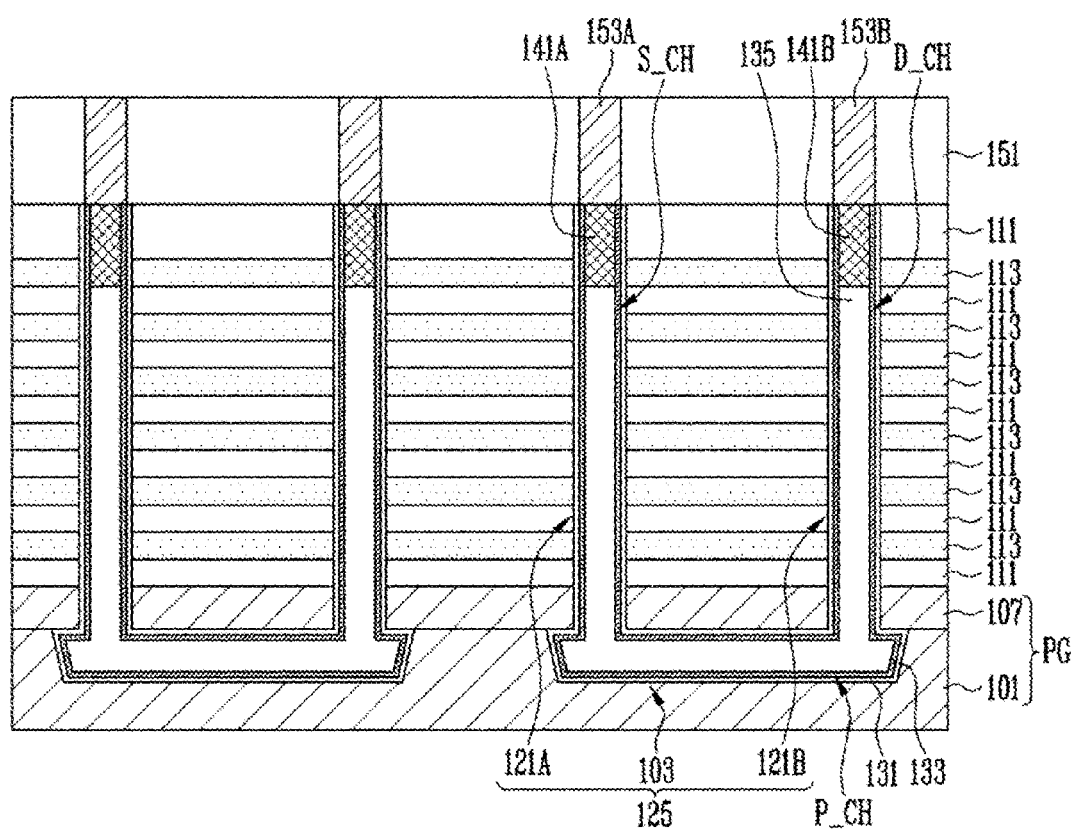

Referring to FIG. 1C, a second interlayer insulating layer 151 is formed on first and second material layers 111 and 113 through which the channel structure 133 passes. The second interlayer insulating layer 151 is formed to cover the channel structure 133, and the first and second material layers 111 and 113.

Then, contact holes exposing first and second channel layers S_CH and D_CH of the channel structure 133, are formed by etching the second interlayer insulating layer 151. The first and second doped silicon patterns 141A and 141B may be exposed through the contact holes.

By filling the contact holes with a conductive material, a first contact plug 153A connected to the first channel layer S_CH and a second contact plug 153B connected to the second channel layer D_CH are formed. When the first and second doped silicon patterns 141A and 141B are formed, the first and second doped silicon patterns 141A and 141B may reduce a contact resistance between the first contact plug 153A and the first channel layer S_CH, and a contact resistance between the second contact plug 153B and the second channel layer D_CH.

Figure 1D:
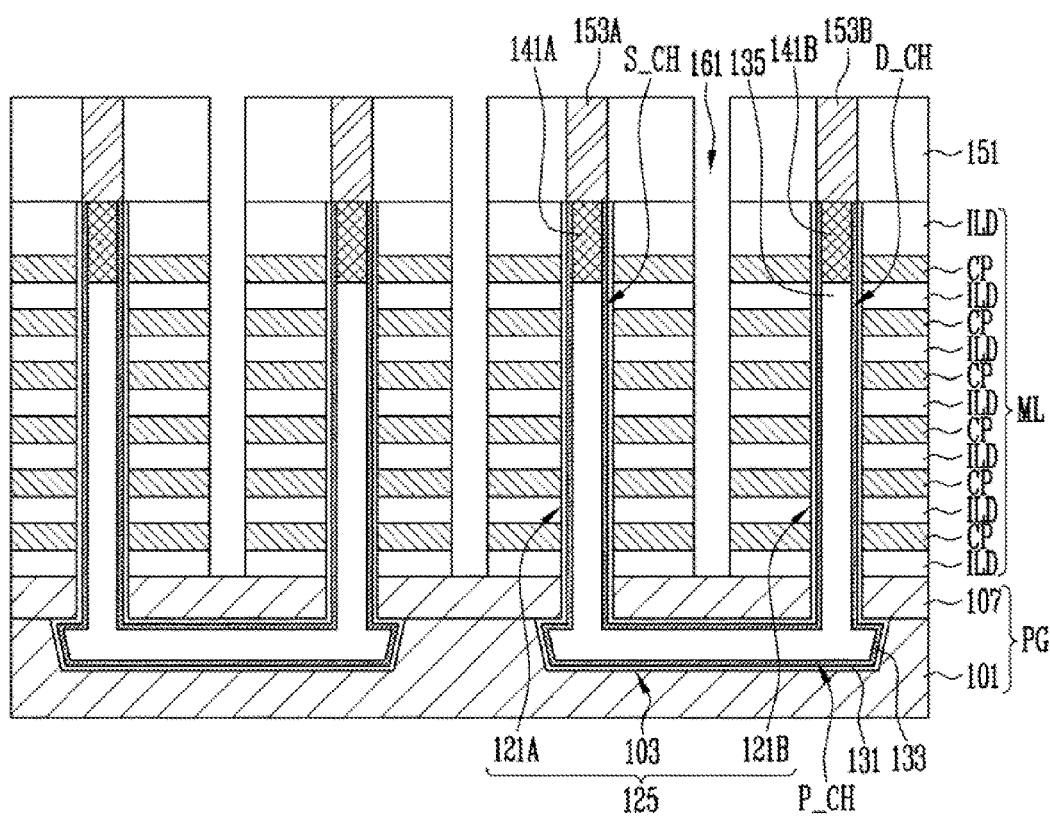

Referring to FIG. 1D, a slit 161 is formed by etching the second interlayer insulating layer 151 through which the first and second contact plugs 153A and 153B pass, and first and second material layers 111 and 113 as shown in FIG. 1C, through which the first and second channel layers S_CH and D_CH pass. The slit 161 passes through the first and second material layers 111 and 113 between the first channel' layer S_CH and the second channel layer D_CH. The slit 161 divides the first material layers 111 and second material layers 113 into stack structures. After the slit 161 is formed, while the slit 161 is open, stress applied to a substrate (not shown) may bend the first material layers 111 and the second material layers 113. The first and second channel layers S_CH and D_CH according to the first embodiment of the present invention are aligned with the first and second contact plugs 153A and 153B before the slit 161 is formed. Thus, even if the first material layers 111 and the second material layers 113 are bent due to stress applied while the slit 161 is open, misalignment between the first and second channel layers S_CH and D_CH and the first and second contact plugs 153A and 153B does not occur. Since the slit 161 according to the first embodiment of the present invention, passes through the second interlayer insulating layer 151 formed on the first and second channel layers S_CH and D_CH as well as the first and second material layers 111 and 113, the slit 161 may be formed higher than the first and second channel layers S_CH and D_CH.

After the slit 161 is formed, the following process may be modified according to the material properties of the first and second material layers 111 and 113.

For example, when the first material layers 111 are formed of an insulating material and the second material layers 113 are formed of a conductive material, first interlayer insulating layers ILD that consist of the first material layers 111 and first conductive patterns CP that consist of the second material layers 113 may be divided into stack structures ML by the slit 161. In this case, after the slit 161 is formed, the following process is performed which is described with reference to FIG. 1E.

When the first material layers 111 are formed of an insulating material and the second material layers 113 are formed of a sacrificial material, and after the slit 161 is formed, a process for forming recess regions by removing the second material layers 113 exposed through the slit 161, and a process in which the first conductive patterns CP is formed in the recess regions, may sequentially performed. The first conductive patterns CP and the first interlayer insulating layers ILD that consist of the first material layers 111 may be divided into the stack structures ML by the slit 161.

Alternatively, when the second material layers 113 are formed of a conductive material and the first material layers 111 are formed of a sacrificial material, and after the slit 161 is formed, a process for forming recess regions by removing the first material layers 111 exposed through the slit 161, and a process in which the first interlayer insulating layers ILD are formed by filling the recess regions with the insulating material, may be sequentially performed. The first interlayer insulating layers ILD and the first conductive patterns CP that consist of the second material layers 113 may be divided into the stack structures ML by the slit 161.

Using various processes as described above, the stack structures ML divided by the slit 161 may be formed. The stack structures ML include a first stack structure covering the first channel layer S_CH and a second stack structure covering the second channel layer D_CH. The first conductive patterns CP of the first stack structure may be used as word lines and a source select line. The first conductive patterns CP of the second stack structure may be used as word lines and a drain select line. At least one of the source select line and the drain select line may be stacked on the word lines.

Figure 1E:
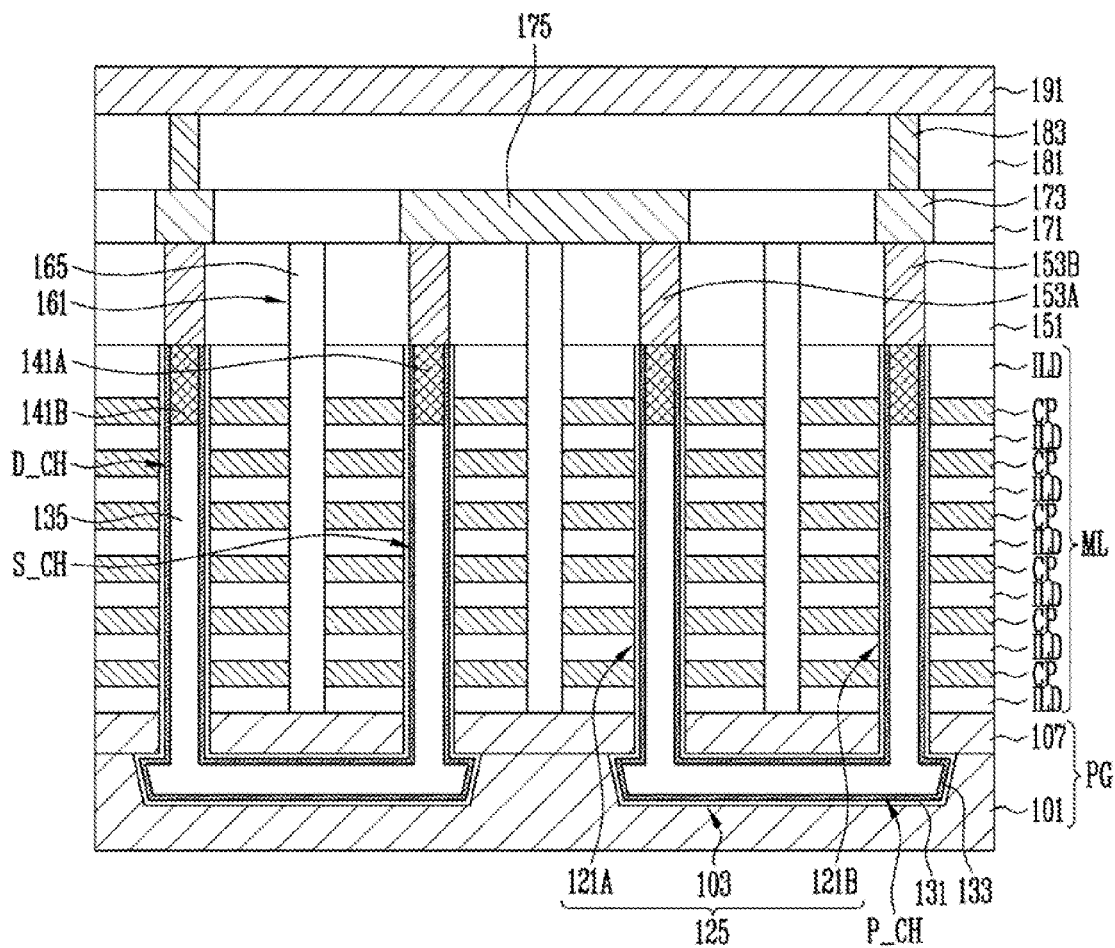

Referring to FIG. 1E, after the stack structures ML divided by the slit 161 are formed, the inside of the slit 161 is filled with a slit insulating layer 165. As the slit insulating layer 165 according to the first embodiment of the present invention passes through the second interlayer insulating layer 151 as well as the first conductive patterns CP and the first interlayer insulating layers ILD, the slit insulating layer 165 protrudes higher than the stack structures ML.

After the slit insulating layer 165 is formed, a third interlayer insulating layer 171 is formed on the second interlayer insulating layer 151. Then, a source line 175 and a first drain contact plug 173 passing through the third interlayer insulating layer 171, may be formed. The source line 175 is connected to the first contact plug 153A and the first drain contact plug 173 is connected to the second contact plug 153B. The source line 175 may be a second conductive pattern extending in the same direction as the first conductive patterns CP divided by the slit 161.

Then, a fourth interlayer insulating layer 181 is formed on the third interlayer insulating layer 171, and a second drain contact plug 183 connected to the first drain contact plug 173 through the fourth interlayer insulating layer 181 is formed. Then, a bit line 191 connected to the second drain contact plug 183 is formed on the fourth interlayer insulating layer 181. The bit line 191 may be a third conductive pattern extending in a crossing direction with the first conductive patterns CP divided by the slit 161.

The semiconductor device according to the first embodiment of the present invention as described above includes the first interlayer insulating layers ILD and the first conductive patterns CP, which are alternately stacked and divided into the stack structures ML by the slit 161, the second interlayer insulating layer 151 through which the slit 161 passes and which is formed on the first interlayer insulating layers ILD and the first conductive patterns CP, the channel structure 133 passing through the stack structures ML, the pipe gate PG covering the channel structure 133 under the stack structures ML, and the first and second contact plugs 153A and 153B connected to the channel structure 133 through the second interlayer insulating layer 151.

The channel structure 133 includes the first channel layer S_CH and the second channel layer D_CH passing through the first interlayer insulating layers ILD and the first conductive patterns CP, and the pipe channel layer P_CH connecting the first channel layer S_CH and the second channel layer D_CH. The pipe gate PG is a conductive pattern covering the pipe channel layer P_CH. The first contact plug 153A is connected to the first channel layer S_CH and the second contact plug 153B is connected to the second channel layer D_CH. The source line 175 is connected to the first contact plug 153A and the source line 175 is in contact with the upper side of the second interlayer insulating layer 151.

The inside of the slit 161 is filled with the slit insulating layer 165. The slit 161 and the slit insulating layer 165 extend from the bottom of the stack structures ML to at least the bottom of the source line 175 and are formed higher than the channel structure 133.

According to the above-described structure, the cell string of the semiconductor device according to the first embodiment of the present invention may be formed in a U shape along the channel structure 133 including the first and second channel layers S_CH and D_CH and the pipe channel layer P_CH. The cell string may include a source select transistor, source-side memory cell transistors, a pipe transistor, drain-side memory cell transistors and a drain select transistor connected in series along the channel structure 133. The source-side select transistor may be formed at an intersection of the first channel layer S_CH and at least one from the uppermost layer among the first conductive patterns CP. The source-side memory cell transistors may be formed at the intersections of the first channel layer S_CH and the first conductive patterns CP disposed under the source select transistor. The pipe transistor may be formed at the intersection of the pipe gate PG and the pipe channel layer P_CH. The drain-side select transistor may be formed at an intersection the second channel layer D_CH and at least one from the uppermost layer among the first conductive patterns CP. The drain-side memory cell transistors may be formed at the intersections of the second channel layer D_CH and the first conductive patterns CP disposed under the drain select transistor.

Figure 2:
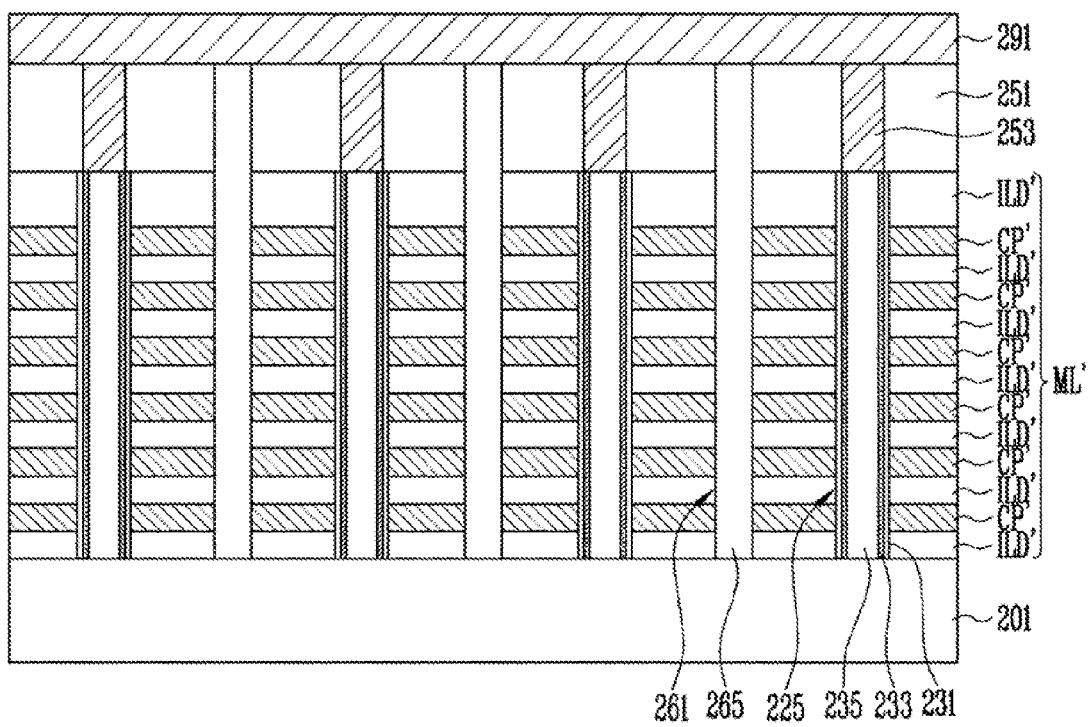
FIG. 2 is a cross-sectional view illustrating a semiconductor device according to a second embodiment of the present invention.

FIG. 2 is a cross-sectional view for describing a semiconductor device according to a second embodiment of the present invention. Specially, the semiconductor device according to the second embodiment of the present invention may be formed using the processes and materials as described above in FIGS. 1A to 1E. Hereinafter, detailed descriptions of similar features disclosed in the first embodiment of the present invention, will be omitted.

Referring to FIG. 2, first material layers and second material layers are alternately stacked on a substrate 201. The substrate 201 may be a material having a semiconductor property. The substrate 201 includes a source region (not shown) doped with impurities. The first material layers and the second material layers may be formed using the same materials as the first material layers and the second material layers described above in FIG. 1A.

Through holes 225 passing through the first material layers and the second material layers are formed. Memory layers 231 are formed along sidewalls of the through holes 225 using the same processes and materials described above in FIG. 1B. Channel structures 233 are formed in the through holes 225. Center regions of the channel structures 233 are filled with insulating layers 235. When the channel structures 233 are formed to fill the through holes 225, the process of forming the insulating layers 235 may be omitted. The channel structures 233 according to the second embodiment of the present invention, may be formed in a straight shape. The channel structures 233 may be connected to the substrate 201 including the source region.

Using the same processes described above in reference to FIG. 1C, a second interlayer insulating layer 251 is formed on the first and second material layers through which the channel structures 233 pass, and contact plugs 253 connected to the channel structures 233 through the second interlayer insulating layer 251 are formed. As described above in FIG. 1D, a slit 261 passing through the second interlayer insulating layer 251 and the first and second material layers is formed. After the slit 261 is formed, the following process may be changed according to material properties of the first and second material layers, as described above in FIG. 1D.

In the second embodiment of the present invention, using the processes described above in reference to FIG. 1D, stack structures ML' divided by the slit 261 and including alternately stacked first interlayer insulating layers ILD' and first conductive patterns CP' may be formed. The first conductive patterns CP' may be used as word lines, a first select line and a second select line. At least one first select line may be stacked, and the word lines are stacked on the first select line. At least one second select line may be stacked on the word lines.

After the stack structures ML' divided by the slit 261 are formed, the inside of the slit 261 is filled with a slit insulating layer 265. Additionally, a bit line 291 connected to the contact plugs 253 is formed on the second interlayer insulating layer 251. The bit line 291 may be a second conductive pattern extending in a crossing direction with the first conductive patterns CP' divided by the slit 261.

The semiconductor device according to the second embodiment of the present invention includes the stack structures ML'. The stack structures ML' cover the channel structures 233 and include the alternately stacked first interlayer insulating layers ILD' and first conductive patterns CP', the slit insulating layer 265 located in the region between stack structures ML' and protruding higher than the stack structures ML', and the second interlayer insulating layer 251, which is formed on the stack structures ML'. According to the above-described structure, the slit insulating layer 265 according to the second embodiment of the present invention, may be formed higher than the channel structures 233. The contact plugs 253 connected to the channel structures 233 pass through the second interlayer insulating layer 251 through which the slit insulating layer 265 passes. An upper side of the second interlayer insulating layer 251 may be in contact with the bit line 291 connected to the contact plugs 253. As a result, the slit insulating layer 265 may extend from the bottom of the stack structures ML' to at least the bottom of the bit line 291.

According to the above-described structure, the cell string of the semiconductor device according to the second embodiment of the present invention, may be formed to be straight along the channel structures 233. The cell string may include a source select transistor, memory cell transistors and a drain select transistor connected in series along the channel structures 233. The source select transistor may be formed at an intersection of the channel structures 233 and at least one from the lowermost layer among the conductive patterns CP'. The drain select transistor may be formed at an intersection of the channel structures 233 and on at least one from the uppermost layer among the conductive patterns CP'. The memory cell transistors may be formed at the intersections of the conductive patterns CP' between the drain select transistor and the source select transistor and the channel structure 233.

Figure 3:
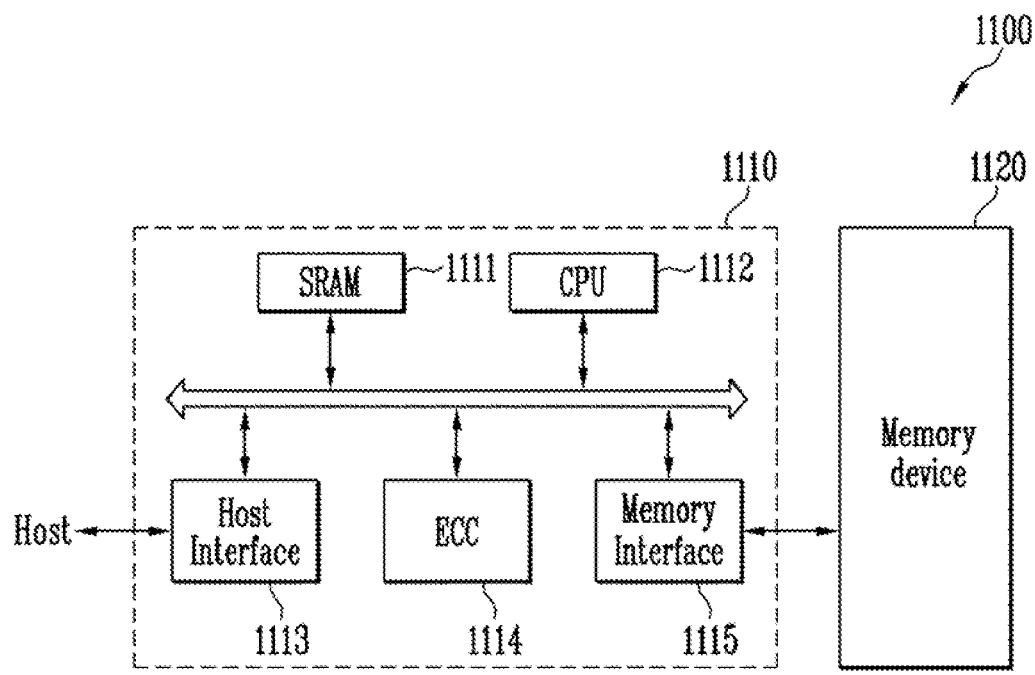
FIG. 3 is a schematic diagram illustrating a configuration of a memory system according to an embodiment of the present invention.

FIG. 3 is a schematic diagram illustrating a configuration of a memory system according to an embodiment of the present invention.

Referring to FIG. 3, a memory system 1100 according to the embodiment of the present invention includes a memory device 1120 and a memory controller 1110.

The memory device 1120 includes the cell string described above with reference to embodiments of the invention described in FIGS. 1A to 2. The memory device 1120 may be a multi-chip package comprising a plurality of flash memory chips.

The memory controller 1110 is configured to control the memory device 1120 and may include a static random access memory (SRAM) 1111, a central processing unit (CPU) 1112, a host interface 1113, an error correction code (ECC) 1114, and a memory interface 1115. The SRAM 1111 is used as an operation memory of the CPU 1112, the CPU 1112 is configured to perform overall control operations for exchanging data of the memory controller 1110, and the host interface 1113 has a data exchanging protocol of the host connected to the memory system 1100. The ECC 1114 is configured to detect and correct errors in data read from the memory device 1120, and the memory interface 1115 is configured to perform interfacing with the memory device 1120. In addition, the memory controller 1110 may further include a read only memory (ROM) to store code data for interfacing with the host.

The memory system 1100 having such a configuration may be a memory card or a solid state disk (SSD) to which the memory device 1120 and the memory controller 1110 are combined. For example, when the memory system 1100 is an SSD, the memory controller 1110 may communicate with the outside (for example, a host) through one of various protocols, such as Universal Serial Bus (USB), MultiMediaCard (MMC), Peripheral Component Interconnect-Express (PCI-E), Serial-Advanced Technology Attachment (SATA), Parallel-Advanced Technology Attachment (PATA), Small Computer System Interface (SCSI), Enhanced Small Disk Interface (ESDI), Integrated Drive Electronics (IDE), and so on.

Figure 4:
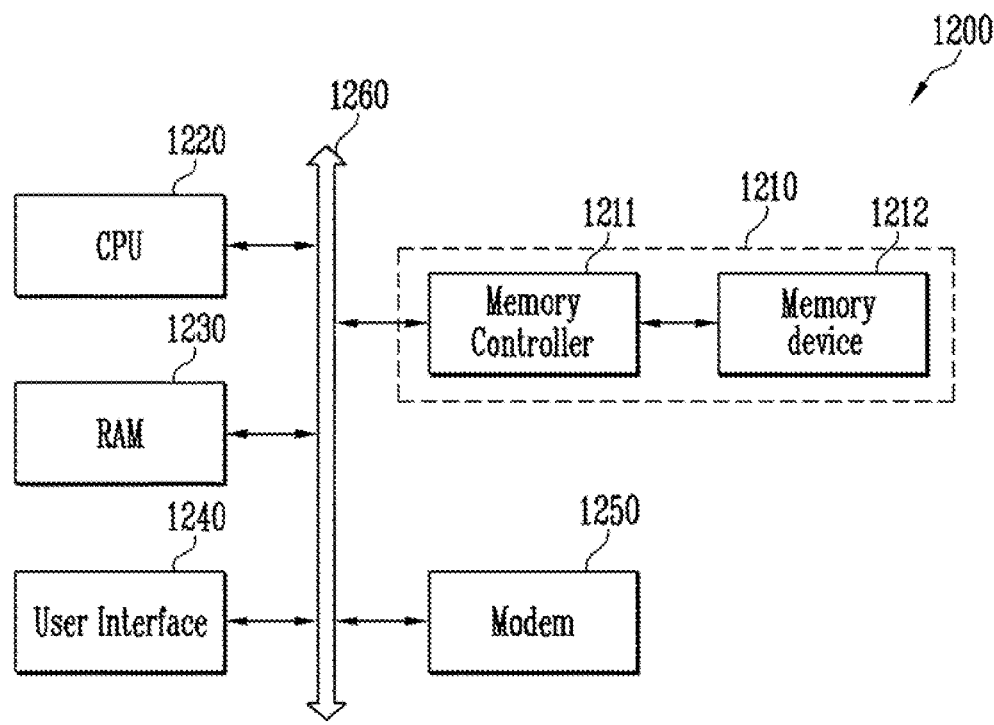
FIG. 4 is a schematic diagram illustrating a configuration of a computing system according to an embodiment of the present invention.

FIG. 4 is a schematic diagram illustrating a configuration of a computing system according to the embodiment of the present invention.

Referring to FIG. 4, a computing system 1200 according to the embodiment of the present invention may include a CPU 1220, a random access memory (RAM) 1230, a user interface 1240, a modem 1250 and a memory system 1210 electrically connected to a system bus 1260. When the computing system 1200 is a mobile device, the computing system 1200 may further include a battery for supplying an operating voltage and may further include an application chipset, a camera image processor (CIS), a mobile dynamic random access memory (DRAM), and so on.

As described above with reference to FIG. 3, the memory system 1210 may include a memory device 1212 and a memory controller 1211.

In this technique, after a contact plug is connected to a channel structure, a slit covering the channel structure and passing through the stacked material layers is formed. Therefore, even if the stacked material layers covering the channel structure are bent by a stress applied after forming the slit, since the channel structure and the contact plug are already aligned, misalignment between the channel structure and the contact plug does not occur.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device, comprising:
   first interlayer insulating layers and first conductive patterns, which are alternately stacked, the first conductive patterns comprising word lines and at least one upper select line stacked over the word lines;
   a second interlayer insulating layer over the first interlayer insulating layers and the first conductive patterns, the first interlayer insulating layer including a lower insulating layer between the word lines and the upper select line and an upper insulating layer between the upper select line and the second interlayer insulating layer;
   channel structures passing through the word lines, the upper select line and the first interlayer insulating layers without passing through the second interlayer insulating layer;
   contact plugs connected to the channel structures and formed on the channel structures, respectively, wherein the contact plugs pass through the second interlayer insulating layer; and
   a slit passing through the second interlayer insulating layer, the first interlayer insulating layers and the first conductive patterns to divide the first interlayer insulating layers and the first conductive patterns into stack structures;
   wherein the slit extends to a same height as the top surfaces of the contact plugs, and
   further comprising:
   a third interlayer insulating layer formed on the second interlayer insulating layer to cover the contact plugs;
   a source line connected to a first contact plug of the contact plugs through the third interlayer insulating layer and that extends in the same direction as the first conductive pattern;
   a fourth interlayer insulating layer formed on the third interlayer insulating layer;
   a drain contact plug connected to a second contact plug of the contact plugs through the fourth interlayer insulating layer and the third interlayer insulating layer; and
   a bit line formed on the drain contact plug.

2. The semiconductor device of claim 1, further comprising a slit insulating layer that fills the inside of the slit and protrudes higher than the stack structures.

3. The semiconductor device of claim 1, wherein a height of the slit is higher than those of the channel structures.

4. The semiconductor device of claim 1, further comprising:
   second conductive patterns connected to the contact plugs.

5. The semiconductor device of claim 4, wherein the slit extends from a bottom of the stack structures to at least a bottom of the second conductive patterns.

6. The semiconductor device of claim 4, wherein the second conductive patterns are bit lines extending in a crossing direction with the first conductive pattern.

7. The semiconductor device of claim 1, wherein each of the channel structures comprises:
   first and second channel layers passing through the first interlayer insulating layers and the first conductive patterns; and
   a pipe channel layer connecting the first and second channel layers under the first interlayer insulating layers and the first conductive patterns.

8. The semiconductor device of claim 7, further comprising a pipe gate that covers the pipe channel layer under the first interlayer insulating layers and the first conductive patterns.

9. The semiconductor device of claim 7, wherein the first contact plug is connected to the first channel layer and the second contact plug is connected to the second channel layer.

10. The semiconductor device of claim 1, wherein the channel structures are foamed in a tube shape having a hollow center region, further comprising:
    insulating layers that fill the hollow center regions of the channel structures and are formed lower than the height of the channel structures; and
    doped silicon patterns that fill the hollow center regions of channel structures on the insulating layers.

11. The semiconductor device of claim 1 wherein the first conductive patterns comprise:
at least one lower select line under the word lines.

* * * * *